United States Patent [19]
Tanaka

[11] Patent Number: 5,331,656
[45] Date of Patent: Jul. 19, 1994

[54] VERY SHORT WAVELENGTH SEMICONDUCTOR LASER

[75] Inventor: Toshiaki Tanaka, Kokubunji, Japan

[73] Assignee: Hitachi, Ltd., Tokyo, Japan

[21] Appl. No.: 97,200

[22] Filed: Jul. 27, 1993

[30] Foreign Application Priority Data

Jul. 31, 1992 [JP] Japan ................ 4-204768

[51] Int. Cl.$^5$ ................................................ H01S 3/19
[52] U.S. Cl. ........................................ 372/45; 372/46
[58] Field of Search ........................ 372/45, 46, 43

[56] References Cited

U.S. PATENT DOCUMENTS

| | | | |
|---|---|---|---|
| 4,750,183 | 6/1988 | Takahashi et al. | 372/45 |
| 4,804,639 | 2/1989 | Yablonovitch | 372/45 |
| 4,887,274 | 12/1989 | Hayakawa et al. | 372/45 |
| 4,890,293 | 12/1989 | Taneya et al. | 372/46 |
| 4,999,844 | 3/1991 | Imamoto | 372/45 |
| 5,042,045 | 8/1991 | Sato | 372/46 |
| 5,095,488 | 3/1992 | Yamamoto et al. | 372/45 |
| 5,172,384 | 12/1992 | Goronkin et al. | 372/45 |

*Primary Examiner*—Georgia Y. Epps
*Attorney, Agent, or Firm*—Antonelli, Terry, Stout & Kraus

[57] ABSTRACT

A laser device, for example, a diode, is provided which has an oscillation wavelength shorter than 600 nm by using III-V semiconductor materials. This is achieved by using nitrogen doping with GaInP material on a GaP substrate to increase the critical layer thickness of the strained layer. As one example, the following layers can be epitaxially-grown in order on an n-type GaP substrate 1 by a molecular beam epitaxy (MBE) method: a Si-doped n-type $Al_yGa_{1-y}P$ optical waveguide layer; a multiple quantum well layer made by repeatedly forming four nitrogen-doped $Ga_{x1}In_{1-x1}P$ quantum barrier layers and three nitrogen-doped $Ga_{x2}In_{1-x2}P$ quantum well layers; a Zn-doped p-type $Al_yGa_{1-y}P$ optical waveguide layer; a Zn-doped p-type $Ga_{x3}In_{1-x3}P$ thin layer; and a Zn-doped p-type $Al_yGa_{1-y}P$ optical waveguide layer. Next, the thin $Ga_{x3}In_{1-x3}P$ layer is processed to form a ridge stripe. Then, an n-type Gap current constriction layer is selectively grown and a p-electrode and an n-electrode are formed. Using such a structure, it is possible to obtain a yellow laser element having a threshold current of 100 to 150 mA and an oscillation wavelength of 565 to 580 nm controlled in the transverse mode under continuous-wave (CW) room-temperature operation. Other embodiments use either a single quantum well layer or superlattice layers to obtain either yellow-green light or orange light of very short wavelengths.

15 Claims, 11 Drawing Sheets

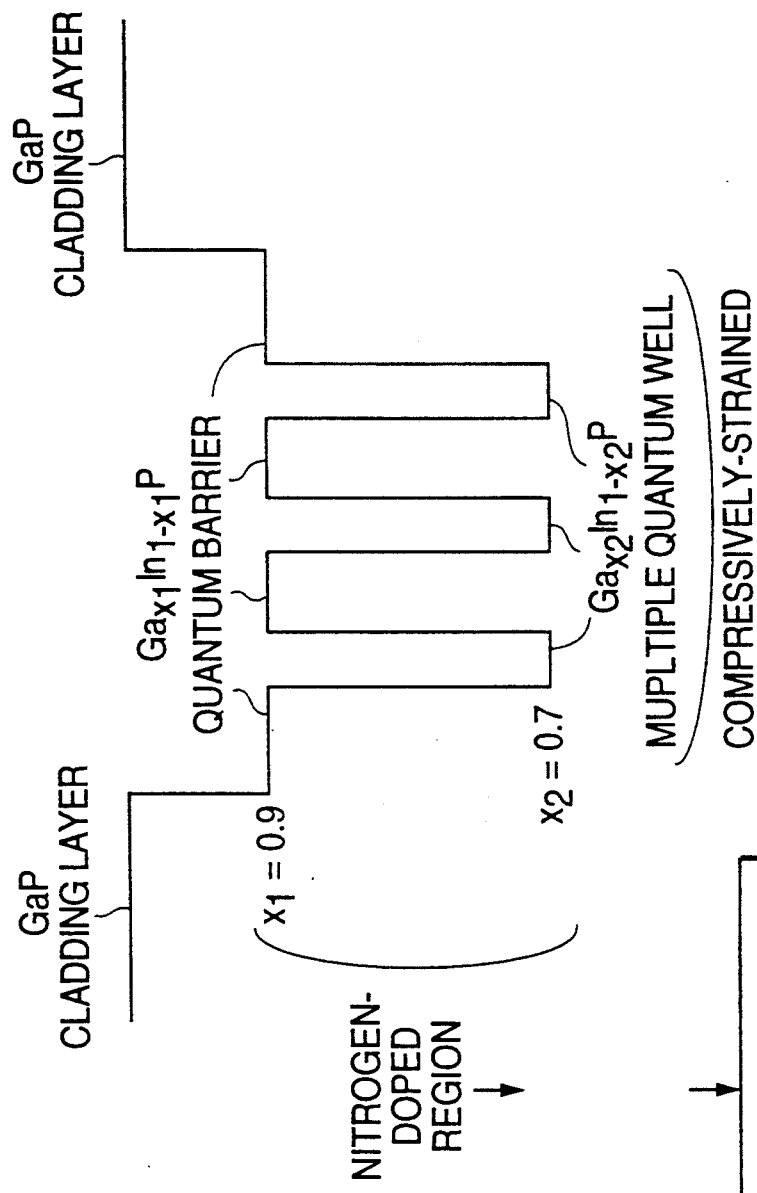
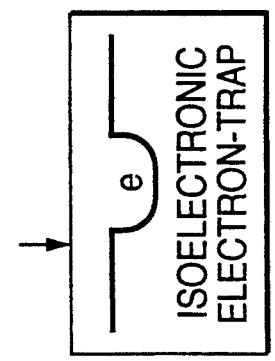

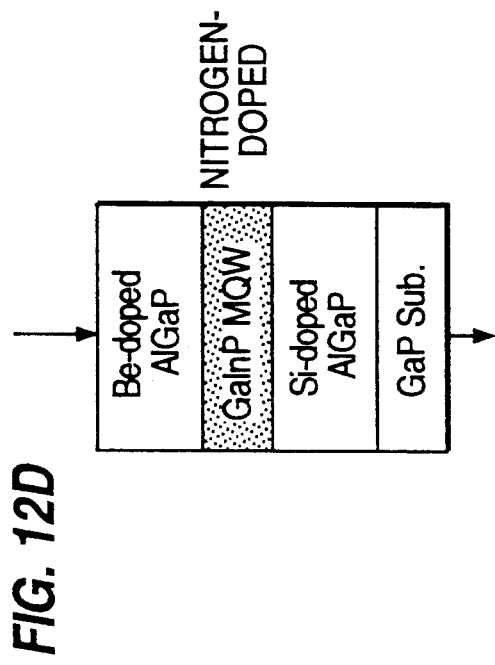
FIG. 12D
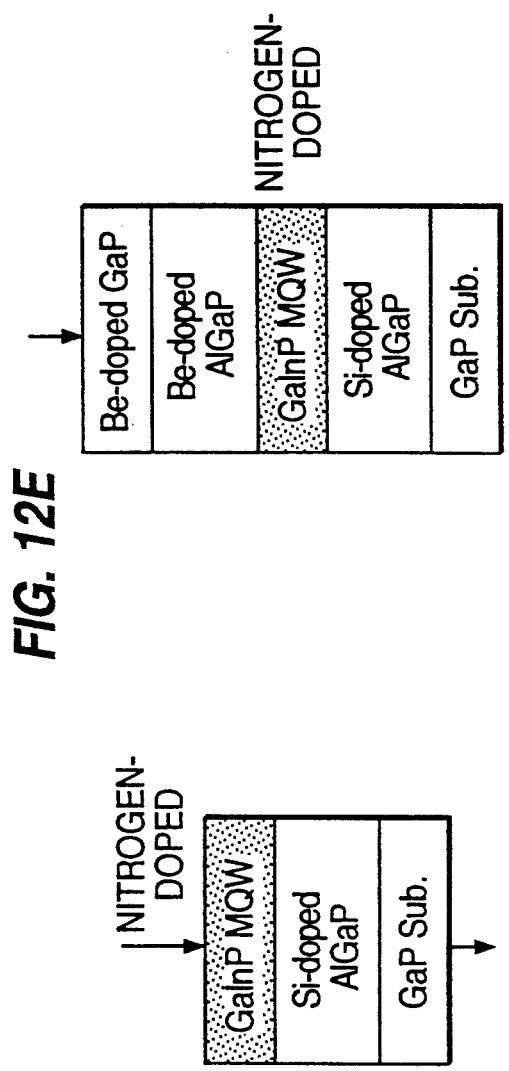
FIG. 12E
FIG. 12A
FIG. 12B
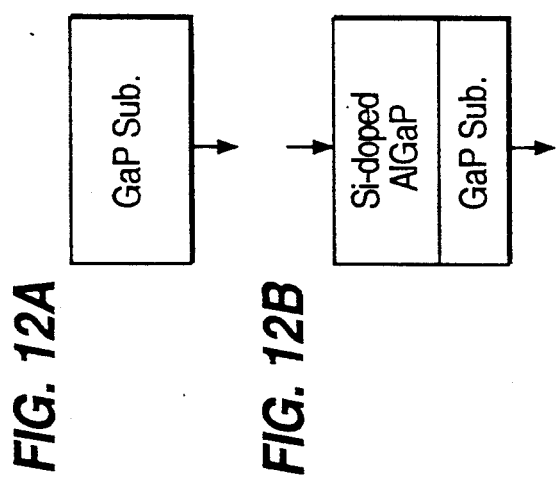
FIG. 12C
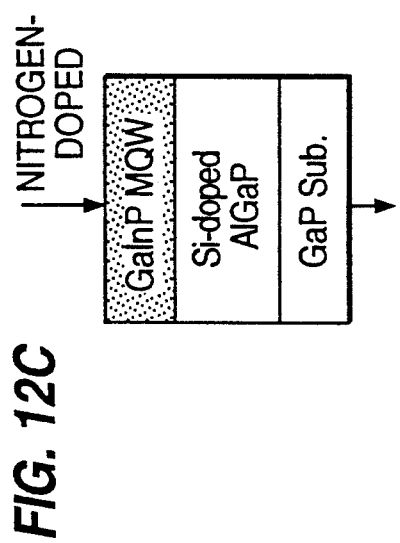

(WITHOUT N₂ DOPING)

(WITH N₂ DOPING)

VERY SHORT WAVELENGTH SEMICONDUCTOR LASER

BACKGROUND OF THE INVENTION

The present invention relates to a short-wavelength visible semiconductor laser device suitable for optical information processing or for a light source for optical measurement processing.

In a first known example disclosed in an article by Ishikawa et al. in Electronics Letters, Vol. 26 (1990), page 211, an Al GaInP LD (Laser Diode) is described, in which an active layer of a high Al (aluminum) content is used to increase the band gap energy. This previous device realizes continuous-wave (CW) room temperature oscillation at a 630 nm band, which has been the shortest so far, prior to the present invention.

For III-V semiconductor materials, however, a specific semiconductor material and laser structure to obtain an oscillation wavelength of 600 nm or less at room temperature is not described in the Ishikawa article, or in the prior art in general. Also for a laser device manufactured by II-VI semiconductor materials, a satisfactory material for realizing an oscillation wavelength between 550 and 590 nm has not yet been discovered, and such a laser structure has not been successfully studied.

For the above prior art, only AlGaInP for lattice-matching with a GaAs substrate is considered among III-V semiconductor materials, and a shorter wavelength of 630 nm or less has not previously been obtained as an oscillation wavelength under continuous wave (CW) room temperature conditions.

SUMMARY OF THE INVENTION

It is an object of the present invention to obtain a laser device having an oscillation wavelength shorter than 600 nm, which is shorter than any wavelength previously obtained from III-V semiconductor materials. Moreover, it is another object of the present invention to provide a laser with a yellow-green to orange wavelength range of 550 to 590 nm, which can hardly be realized even by using wide-gap II-VI semiconductor materials. To accomplish this, the present invention describes materials and the design of a laser structure using a GaP semiconductor substrate, and introduces a GaInP strain quantum well or a superlattice layer in an active layer.

The following is a description of the means for achieving the above objects. To begin with, for the present invention, an optical waveguide layer is formed of a semiconductor material AlGaP so that a larger band gap energy can be set in order to confine carriers in an active layer. The semiconductor substrate is a GaP substrate which permits lattice-matching with the optical waveguide layer. The active layer uses a semiconductor material GaInP which has the largest band gap energy among III-V semiconductor materials, except nitride. A $Ga_xIn_{1-x}P$ layer is a material of the direct transition type up to 0.73 of the composition "x" of Ga, and it is possible to use the $Ga_xIn_{1-x}P$ layer of up to this composition for a luminescent active layer. However, the GaInP layer serves as a strain system which applies a compressive strain between the GaP substrate and the GaInP active layer. Therefore, it is necessary to form the active layer at a layer thickness of the critical layer thickness or less so that dislocations do not occur from the strain. The present invention specifies the layer thickness, and offers a novel method to increase the critical layer thickness by introducing nitrogen atoms as an impurity dopant, as will be discussed in detail hereinafter.

The present invention also offers another advantage. Specifically, because the Ga composition "x" of the $Ga_xIn_{1-x}P$ layer used for the active layer uses a composition in the vicinity of a position where the direct-transition point Γ band-intersects with the indirect-transition point X, the transition probability decreases even in the direct-transition composition range. The AlGaP waveguide layer or $Ga_xIn_{1-x}P$ active layer of the present invention is mainly doped with nitrogen as an isoelectronic trap impurity separately from a conductivity-type impurity. With this technique, it is possible to improve the direct-transition luminescent probability even in a region where the vicinity of indirect transition or the indirect-transition point X is lower than the direct-transition point Γ. It is to be noted that such an isoelectronic trap has been achieved in a different material, specifically GaAsP, as disclosed in an article in Applied Physics Letters, Vol. 19, Number 6, page 184 (1971).

The following is the description of the means for achieving the above described objects.

The basic principle of the present invention is to use a GaP semiconductor substrate and introduce a material GaInP having a larger lattice constant than the substrate which will serve as a strain system in an active layer. For the $Ga_xIn_{1-x}P$ layer, because the composition "x" is of direct-transition up to 0.73 and the band gap energy is 2.239 eV, the wavelength may be shortened to approximately 553 nm. However, when increasing the composition "x", a compressive strain is applied to the GaInP layer. With regard to this, a restriction occurs in that the layer thickness cannot be increased above the critical layer thickness. Specifically, as shown in FIG. 1A, the critical layer thickness $L_c$ is a maximum thickness of the GaInP layer, above which dislocations will be formed from the released strain. It is an object of the present invention to increase this critical layer thickness.

FIG. 1B shows a result of obtaining the relationship between the calculated critical layer thickness $L_c$ and a composition "x" of the $Ga_xIn_{1-x}P$ layer to the GaP substrate. Because the calculated critical layer thickness is approx. 5 nm for the composition of 0.73, it is necessary to set the layer thickness of the active region to 5 nm or less. Because a region of the direct transition type with the composition of 0.73 or less has the restriction of the critical layer thickness, the active layer inevitably has a quantum well structure in which the quantum size effect occurs. It is necessary to set the composition and layer thickness of each layer in the quantum well structure so that they do not exceed the critical layer thickness as a whole.

On the other hand, a tensile strain is induced in the present invention by introducing nitrogen atoms as an impurity dopant for GaInP quantum well and/or barrier layers, because of the small size of nitrogen atoms which are substituted with phosphorus. The tensile strain can help the compensation for the stress induced by the compressive strain which occurs in the GaInP layers grown on GaP substrates, and also can increase the critical layer thickness of compressively-strained GaInP layers on the substrates. This suggests that the nitrogen-doped GaInP strained-layer multiple quantum well structures are advantageous for a better device design which results in high performance of laser characteristics.

For the quantum well structure, it is preferable to set the Ga composition "x" as small as possible in the direct transition region so that the density of states decreases by effectively using the quantum size effect and introducing the strain. In this case, it is also possible to improve the direct-transition luminescent efficiency of the quantum well layer. When considering these factors, the composition of the quantum well layer is preferably in the range between 0.60 and 0.73, and it is preferably an atomic monolayer or thinner than 10 nm. For the quantum barrier layer, however, the composition is preferably in the range between 0.65 and 1.0, and it is preferably an atomic monolayer or thinner than 25 nm though depending on the number of wells of the multiple quantum well structure.

Moreover, as shown in FIG. 8, it is possible to set a large band gap energy between a conductive band and valence band, and to increase the number of heterobarriers against the quantum well structure by increasing the average compressive strain of each layer forming the barrier layer. Therefore, a strained superlattice layer in which a compressively strained layer having a sufficiently small composition "x" is periodically formed, and thus is more effective for carrier confinement than a simple quantum barrier layer.

However, because the present invention uses the composition of the $Ga_xIn_{1-x}P$ layer close to the indirect-transition region for an active layer, the direct-transition luminescent efficiency tends to decrease. To prevent the luminescent efficiency from decreasing, a technique which is disclosed in an article by Groves et al. in Applied Physics Letters, Vol. 19, Number 6, pp. 184 to 186 (1971) is used in a modified form in the present invention. Specifically, in the Groves et al. article, a GaAsP layer is doped with nitrogen as an isoelectronic trap impurity to improve the direct-transition probability in the indirect-transition region and to increase the luminescent intensity. In the present invention, nitrogen doping is applied to a GaP/GaInP system. Using this, it is possible to improve the direct-transition luminescent efficiency of the indirect-transition region or the vicinity of the region by doping the entire or modulated GaInP active layer with nitrogen.

Moreover, the direct-transition luminescent efficiency can be improved through band-structure folding or zone folding by forming the indirect-transition region or the vicinity of the region into a superlattice layer made by alternately repeatedly forming a barrier layer and well layer whose thicknesses consist of one to several atoms. This is shown, for example, in FIG. 6.

As the result of testing embodiments of the present invention manufactured by considering the above mentioned points, a laser device with yellow-green to orange light with a wavelength of 550 to 590 nm is obtained in the GaP/GaInP system through continuous-wave (CW) room-temperature operation. A detailed discussion of these embodiments follows.

BRIEF DESCRIPTION OF THE DRAWINGS

FIG. 4A is a schematic view showing the conductive band structure of the multiple quantum well layer of another embodiment of the present invention and FIG. 4B shows an isoelectronic electron-trap formed in this embodiment;

FIG. 12A–12E shows a fabrication process for manufacturing a semiconductor device in accordance with the present invention;

DETAILED DESCRIPTION

Embodiment 1

Figure 1A:
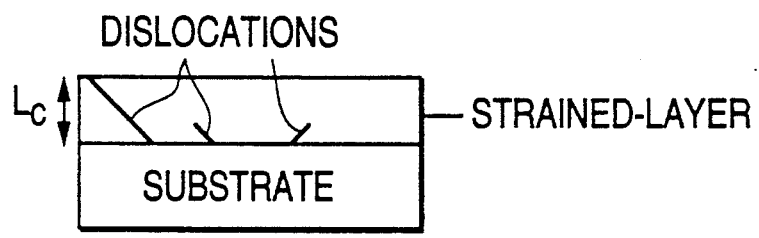
FIG. 1A is an illustration of dislocations formed in a strained layer and FIG. 1B is an illustration showing the relationship between the $Ga_xIn_{1-x}$ layer composition and critical layer thickness on a GaP substrate.
Figure 1B:
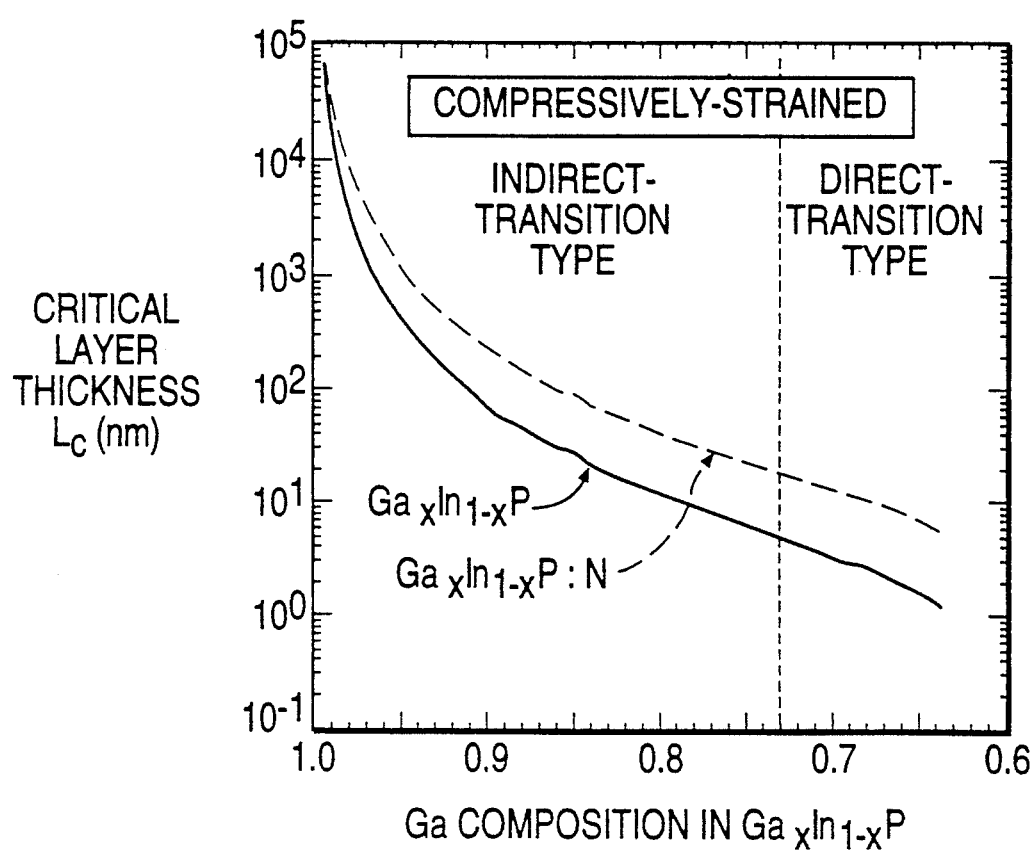
Figure 2:
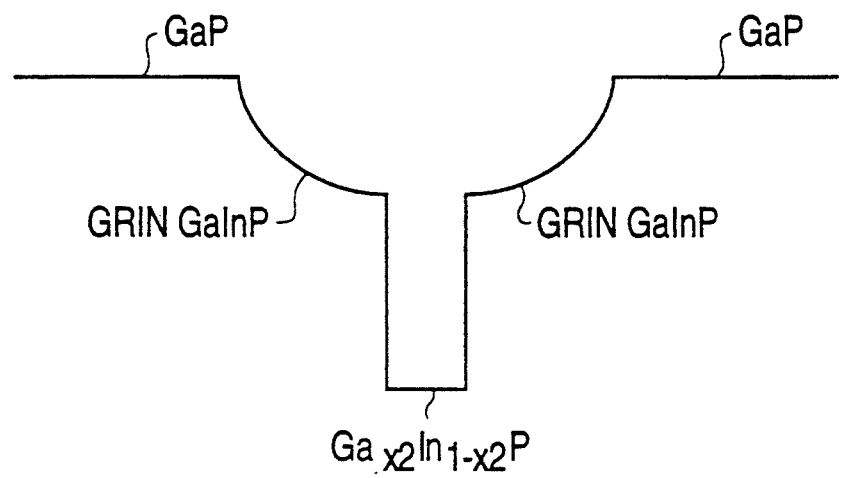
FIG. 2 is a schematic view showing the conductive band y structure of a single quantum well layer of an embodiment of the present invention.
Figure 3:
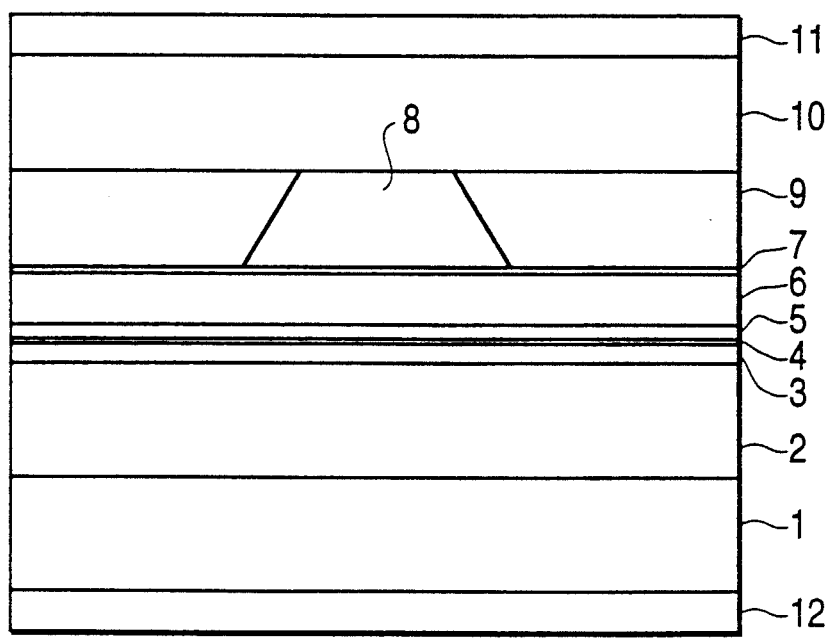
FIG. 3 is a sectional view of a device structure showing an embodiment of the present invention.

A first embodiment of the present invention is described below by referring to FIGS. 2 and 3. In FIG. 3, the following layers are epitaxial-grown in order on an n-type GaP substrate 1 (d=100 μm, $n_D=2\times10^{18}cm^{-3}$) having a surface tilted by 15.8° in the direction of [110][$\bar{1}$10] from the surface (001) by the molecular beam epitaxy (MBE) method or by MOCVD:

a Si-doped n-type $Al_yGa_{1-y}P$ optical waveguide layer 2 (y =0, d=0.5 μm, $n_D=1\times10^{18}cm^{-3}$), a nitrogen-doped $Ga_{x1}In_{1-x1}P$ graded barrier layer 3 (where x1 gradually changes from 1.0 to 0.9 as shown in FIG. 2, d=30 nm), a nitrogen-doped $Ga_{x2}In_{1-x2}P$ quantum well layer 4 (x2=0.65, d=5 nm), and a nitrogen-doped $Ga_{x1}In_{1-x1}P$ graded barrier layer 5 (where x1 gradually changes from 0.9 to 1.0 as shown in FIG. 2, d=30 nm), a Be-doped p-type $Al_yGa_{1-y}P$ optical waveguide layer 6 (y =0, d=0.2 μm, $n_A=7\times10^{17}cm^{-3}$), a Be-doped p-type $Ga_{x3}In_{1-x3}P$ thin layer 7 (x1=0.9, d=3 nm), and a Be-doped p-type $Al_yGa_{1-y}P$ optical waveguide layer 8 (y=0, d=1.0 μm, $n_A=1\times10^{18}cm^{-3}$).

Doping with nitrogen is performed by using plasma $N_2$ radical as the material, and the impurity concentration is kept at the range of $1\times10^{18}$ to $1\times10^{19}cm^{-3}$. Then, a $SiO_2$ mask (layer thickness d=0.2 μm, stripe width=5 μm) is formed by lithography and a ridge stripe is formed by removing the layer 8 by chemical etching until it reaches the layer 7. Then, an n-type GaP current blocking layer 9 (d=1.0 μm, $n_D=3\times10^{18}cm^{-3}$) is selectively grown with the SiO$_2$ mask that is left. The SiO$_2$ mask is removed before recessed-growing a p-type GaP contact layer 10 (d=1 to 2 μm, $n_A=5\times10^{18}$ to $1\times10^{19}cm^{-3}$) to deposit a p-electrode 11 and n-electrode 12. Furthermore, by cleaving and scribing, the laser device can be cut out in the form of a device which has the cross section shown in FIG. 3.

For this embodiment, a yellow laser device is obtained which has a threshold current of 150 to 200 mA under continuous-wave (CW) room-temperature operation, and an oscillation wavelength of 580 to 590 nm controlled in the fundamental transverse mode. For a device with a cavity length of 600 μm, the optical output of 10 mW can be stably operated even at the operating temperature of 70° C.

Embodiment 2

Figure 5:
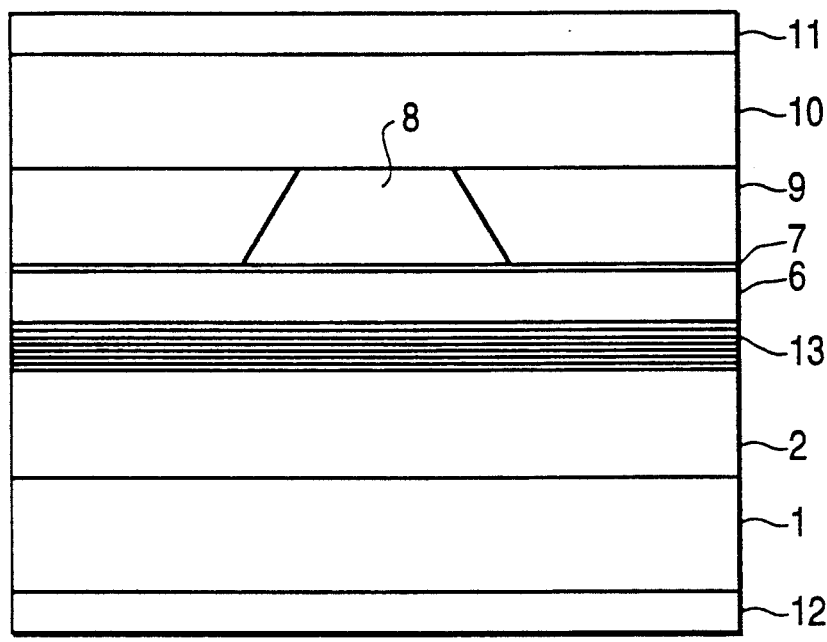
FIG. 5 is a sectional view of the device structure showing still another embodiment of the present invention.

Another embodiment of the present invention is described by referring to FIGS. 4A, 4B and 5. In FIG. 5, the following layers are epitaxial-grown in order on an n-type GaP substrate 1 (d=100 μm, $n_D=2\times10^{18}cm^{-3}$) having a surface tilted by 15.8° in the direction of [110][$\bar{1}\bar{1}0$] from the surface (001) by the molecular beam epitaxy (MBE) method:

a Si-doped n-type Al$_y$Ga$_{1-y}$P optical waveguide layer 2 (y=0, d=0.5 μm, $n_D=1\times10^{18}cm^{-3}$), a multiple quantum well layer 13, shown in FIG. 4A, made by repeatedly forming four nitrogen-doped Ga$_{x1}$In$_{1-x1}$P quantum barrier layers (x1=0.9, d=15 nm), preferably with a Graded Index (known as GRIN), and three nitrogen-doped Ga$_{x2}$In$_{1-x2}$P quantum well layers (x2=0.70, d=3 nm), a Be-doped p-type Al$_y$Ga$_{1-y}$P optical waveguide layer 6 (y=0, d=0.2 μm, $n_A=7\times10^{17}cm^{-3}$), a Be-doped p-type Ga$_{x3}$In$_{1-x3}$P thin layer 7 (x1=0.9, d=3 nm), and a Be-doped p-type Al$_y$Ga$_{1-y}$P optical waveguide layer 8 (y=0, d=1.0 μm, $n_A=1\times10^{18}cm^{-3}$).

Nitrogen doping is performed by using N$_2$ radical as the source material, and the impurity concentration is kept at the range of $1\times10^{18}$ to $1\times10^{19}cm^{-3}$. Then, similarly to the embodiment 1, the substrate 1 is cut out in the form of a device which has the cross section shown in FIG. 5.

For this embodiment, a yellow laser device is obtained which has a threshold current of 100 to 150 mA under continuous-wave (CW) room-temperature operation and an oscillation wavelength of 565 to 580 nm controlled in the fundamental transverse mode. For a device with a cavity length of 600 μm, the optical output of 10 mW can be stably operated even at the operating temperature of 70° C.

FIG. 4B shows an isoelectronic electron-trap in the conduction band structure formed by nitrogen doping of the phosphide semiconductor material. This trap enhances the probability of the direct electron transition, and thus increases the emission intensity from the nitrogen-doped active region. The nitrogen doping also induces a tensile strain which can be released to provide some compensation of stress due to compressive strain in the active region.

Embodiment 3

Figure 6:
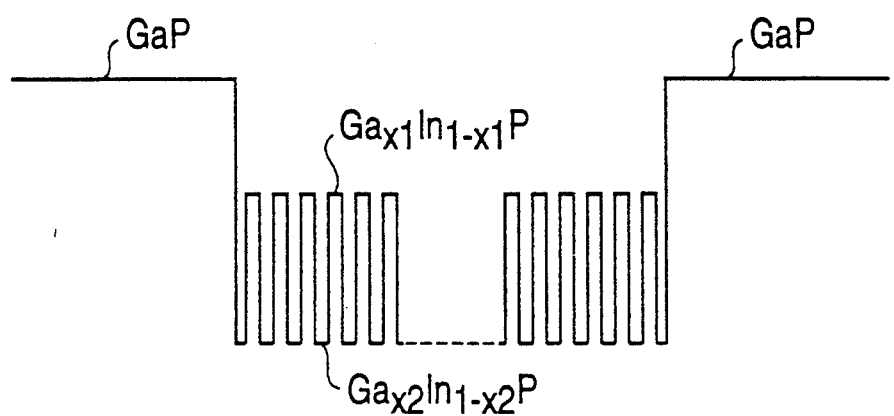
FIG. 6 is a schematic view showing the conductive band structure of the superlattice layer of still another embodiment of the present invention.
Figure 7:
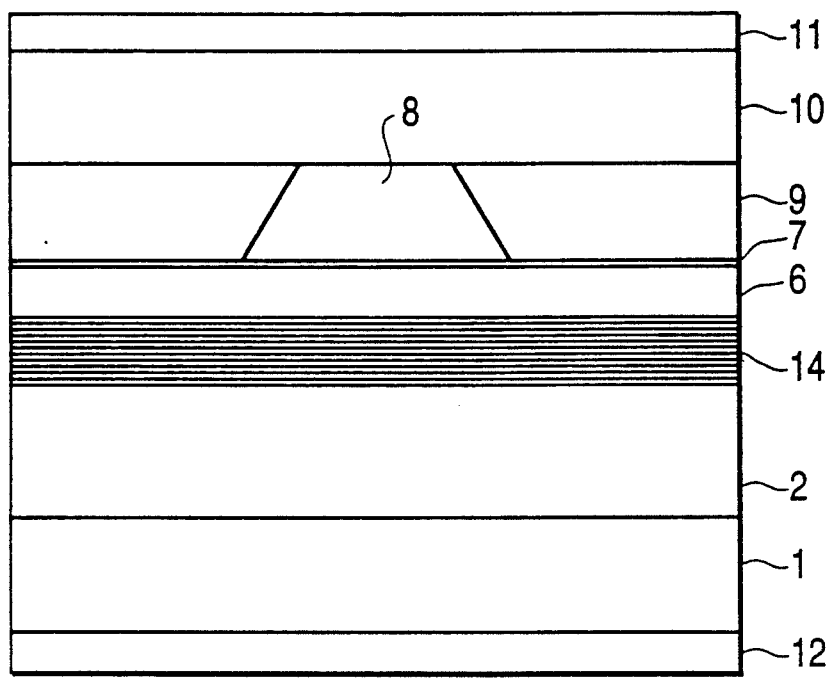
FIG. 7 is a sectional view of the device structure showing still another embodiment of the present invention.

Still another embodiment of the present invention is described below by referring to FIGS. 6 and 7. In FIG. 7, the following layers are epitaxial-grown in order on an n-type GaP substrate 1 (d=100 μm, $n_D=2\times10^{18}cm^{-3}$) having a surface tilted by 15.8° in the direction of [110][$\bar{1}\bar{1}0$] from the surface (001) by the molecular beam epitaxy (MBE) method:

a Si-doped n-type Al$_y$Ga$_{1-y}$P optical waveguide layer 2 (y=0, d=0.5 μm, $n_D=1\times10^{18}cm^{-3}$), a superlattice layer 14 shown in FIG. 6, made by repeatedly forming a pair of a nitrogen-doped Ga$_{x1}$In$_{1-x1}$P atomic monolayer (x1=0.9, d=0.27 nm equivalent to the size of an atom) and a nitrogen-doped Ga$_{x4}$In$_{1-x4}$P atomic monolayer (x4=0.73, d=0.27 nm equivalent to the size of an atom). The number of these layer pairs can, of course, vary, and can easily be set at 100 pairs or more, if desired;

a Be-doped p-type Al$_y$Ga$_{1-y}$P optical waveguide layer 6 (y=0, d,=0.2 μm, $nA=7\times10^{17}cm^{-3}$);

a Be-doped p-type Ga$_{x3}$In$_{1-x3}$P thin layer 7 (x1=0.9, d=3 nm); and a Be-doped p-type Al$_y$Ga$_{1-y}$P optical waveguide layer 8 (y=0, d=1.0 μm, $n_A=1\times10^{18}cm^{-3}$).

Nitrogen doping can be performed by using N$_2$ radical as the material. Preferably, the impurity concentration is kept at the range of $1\times10^{18}$ to $1\times10^{19}cm^{-3}$. Then, similarly to embodiment 1, the substrate 1 is cut out in the form of a device which has the cross section shown in FIG. 7.

For this embodiment, it is possible to improve the direct-transition luminescent efficiency by the point-X folding (zone folding) in the Ga$_x$In$_{1-x}$P layer of indirect transition. As a result, the threshold current can be decreased to 100 to 150 mA under continuous-wave (CW) room-temperature operation, and a green laser device having an oscillation wavelength of 550 to 565 nm controlled in the transverse mode is obtained. For a device with a cavity length of 600 μm, a light output of 10 mW can be stably obtained even at an operating temperature of 50° C.

Embodiment 4

Figure 8:
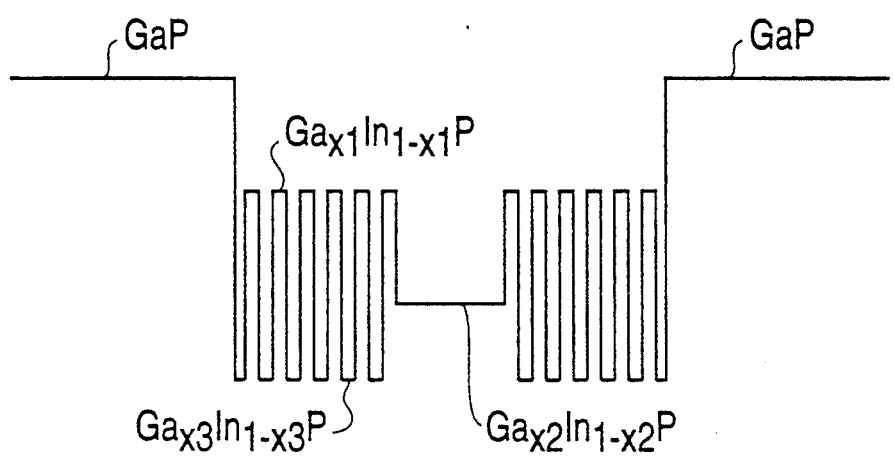
FIG. 8 is a schematic view showing the conductive band structures of the superlattice guide layer and quantum well layer of still another embodiment of the present invention.
Figure 9:
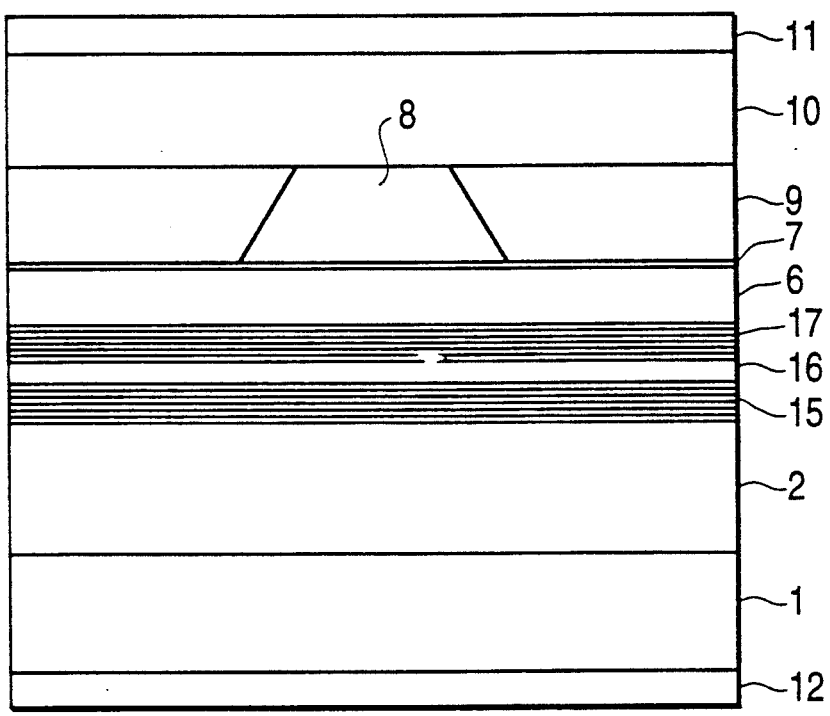
FIG. 9 is a sectional view of the device structure showing still another embodiment of the present invention.

Still another embodiment of the present invention is described below by referring to FIGS. 8 and 9. In FIG. 9, the following layers are epitaxial-grown in order on an n-type GaP substrate 1 (d=100 μm, $nD=2\times10^{18}cm^{-3}$) having a surface tilted by 15.8° in the direction of [110][$\bar{1}\bar{1}0$] from the surface (001) by the molecular beam epitaxy (MBE) method:

a Si-doped n-type Al$_y$Ga$_{1-y}$P optical waveguide layer 2 (y=0, d=0.5 μm, $n_D=1\times10^{18}cm^{-3}$), a superlattice guide layer 15 shown in FIG. 8, made by repeatedly forming a pair of a nitrogen-doped Ga$_{x1}$In$_{1-x1}$P thin barrier layer (x1=0.9, d=1.0 nm) and a nitrogen-doped Ga$_{x4}$In$_{1-x4}$ thin well layer (x4=0.60, d=1.0 nm) up to 10 times, for example, and a superlattice guide layer 17 shown in FIG. 8, made by repeatedly forming a set of a nitrogen-doped Ga$_{x2}$In$_{1-x2}$P quantum well layer 16 (x2=0.73, d=5 nm), a nitrogen-doped Ga$_{x2}$In$_{1-x1}$P thin barrier layer (x1=0.9, d=1.0 nm), and a nitrogen-doped Ga$_{x4}$In$_{1-x4}$P thin well layer (x4=0.60, d=1.0 nm) up to 10 times, for example;

a Be-doped p-type Al$_y$Ga$_{1-y}$P optical waveguide layer 6 (y=0, d=0.2 μm, $n_A=7\times10^{17}cm^{-3}$);

a Be-doped p-type Ga$_{x3}$In$_{1-x3}$P thin layer 7 (x1=0.9, d=3 nm); and a Be-doped p-type $Al_yGa_{1-y}P$ optical waveguide layer 8 (y=0, d=1.0 μm, $n_A=1\times10^{18}cm^{-3}$).

Nitrogen doping can be performed by using $N_2$ radical as the source material. Preferably, the impurity concentration is kept at the range of $1\times10^{18}$ to $1\times10^{19}cm^{-3}$. Then, similarly to embodiment 1, the substrate 1 is cut out in the form of a device which has the cross section shown in FIG. 9.

For this embodiment, it is possible to make the average compressive strain value of the superlattice guide layer made by alternately repeatedly forming the $Ga_{x1}In_{1-x1}P$ thin barrier layer and $Ga_{x4}In_{1-x4}P$ thin well layer larger than that of the $Ga_{x2}In_{1-x2}P$ well layer. By this effect, the band gap energy between the conduction band and valence band of the superlattice guide layer is increased. Thus, it is possible to set a larger heterobarrier against the $Ga_{x2}In_{1-x2}P$ quantum well layer and improve carrier confinement. As a result, the threshold current can be decreased to 100 to 150 mA under continuous-wave (CW) room-temperature operation, and a green laser device having an oscillation wavelength of 550 to 565 nm controlled in the basic transverse mode is obtained. For a device with the cavity length of 600 μm, a light output of 10 mW can be stably obtained even at an operating temperature of 70° C.

The present invention makes it possible to set the composition and layer thickness of the material in the nitrogen-doped GaP/GaInP strained layer quantum well structure within the critical strain range by using a GaP semiconductor substrate. The present invention also realizes continuous-wave (CW) room-temperature operation of a semiconductor laser in the wavelength region shorter than 600 nm. Moreover, embodiments of the present invention make it possible to obtain a laser device which DC-operates at a threshold current of 100 to 150 mA and which has an oscillation wavelength of 550 to 590 nm. For a device with the resonator length of 600 μm, the constant output operation with a light output of 10 mW is achieved at an operating temperature of 70° C.

Figure 10:
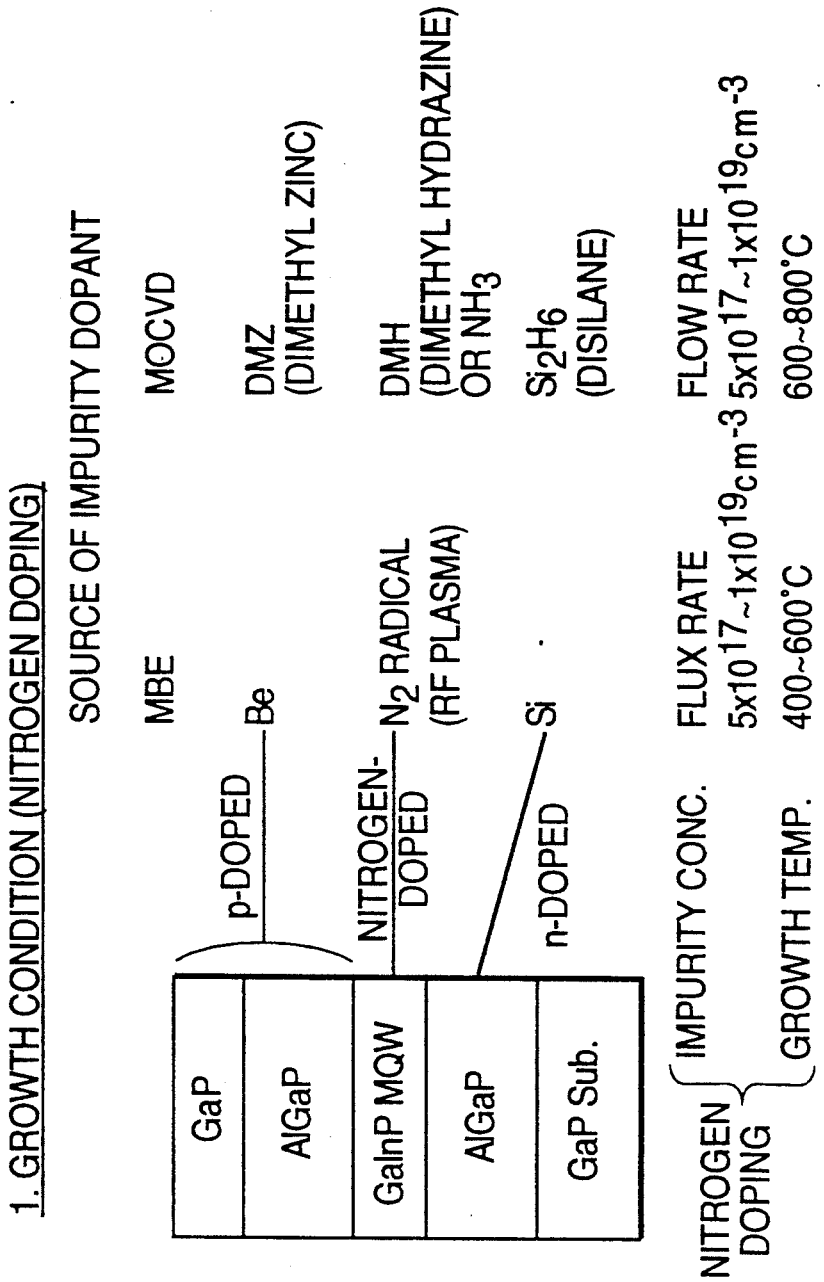
FIG. 10 shows growth conditions for doping in accordance with one embodiment for manufacturing a device in accordance with the present invention.

FIG. 10 shows growth conditions for nitrogen doping to form a structure in accordance with the present invention. Specifically, as shown in FIG. 10, the nitrogen impurity dopant can be added be either MBE or MOCVD processes. FIG. 10 shows the respective materials used for the different doping steps, and the impurity concentrations and growth temperatures for the nitrogen doping step.

Figure 11:
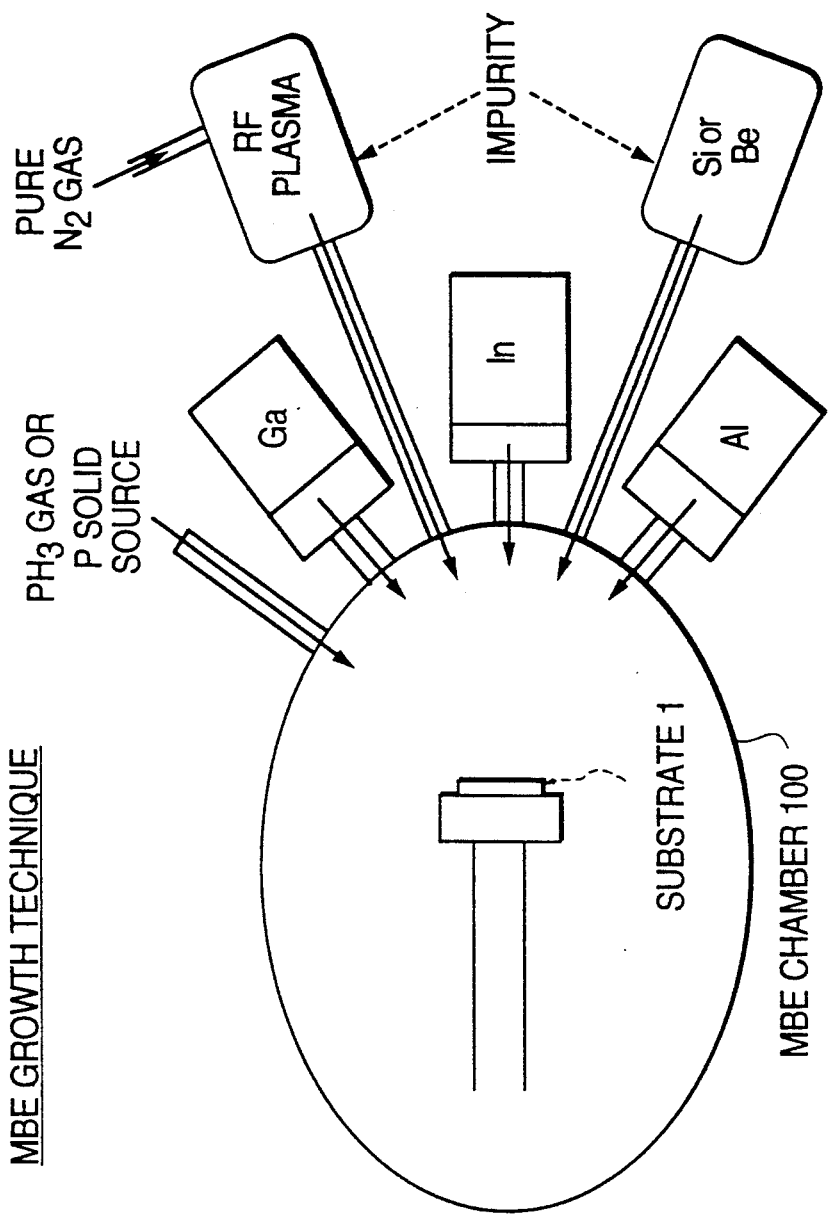
FIG. 11 shows an apparatus that can be used for a MBE growth technique to manufacture an $N_2$ doped device, using an RF plasma $N_2$ source, in accordance with the present invention.

FIG. 11 shows an apparatus that can be used for the MBE growth technique as one example for providing the nitrogen doping used in the present invention. With this apparatus, a substrate 1 is provided within a conventional MBE chamber 100. Material-sources for P, Ga, In, and Al are provided to form the respective layers in accordance with conventional processes. Also, impurity sources for either Si or Be doping are provided, in accordance with conventional manufacturing procedures. However, in addition to this, in accordance with the present invention, a RF plasma $N_2$ source is provided which receives pure $N_2$ gas and converts this into a plasma. This provides the necessary $N_2$ radical for the nitrogen doping to implement the present invention.

FIGS. 12A-12E illustrate the successive steps for manufacturing a device in accordance with the present invention. As can be seen in FIG. 12A, a GaP substrate is first provided. A Si-doped AlGaP layer is then formed on top of the GaP substrate, as shown in 12B. Nitrogen doping is then performed using parameters such as shown in FIG. 10, to form a GaInP multiple quantum well active region, as discussed previously with regard to embodiments such as 2-4, as shown in FIG. 12C. Next, a Be-doped AlGaP layer is formed over the nitrogen doped active region (as shown in FIG. 12D), after which a Be-doped GaP layer is formed (as shown in FIG. 12E). These layers can then be processed to form a striped region and to add electrodes, as discussed previously.

Figure 13:
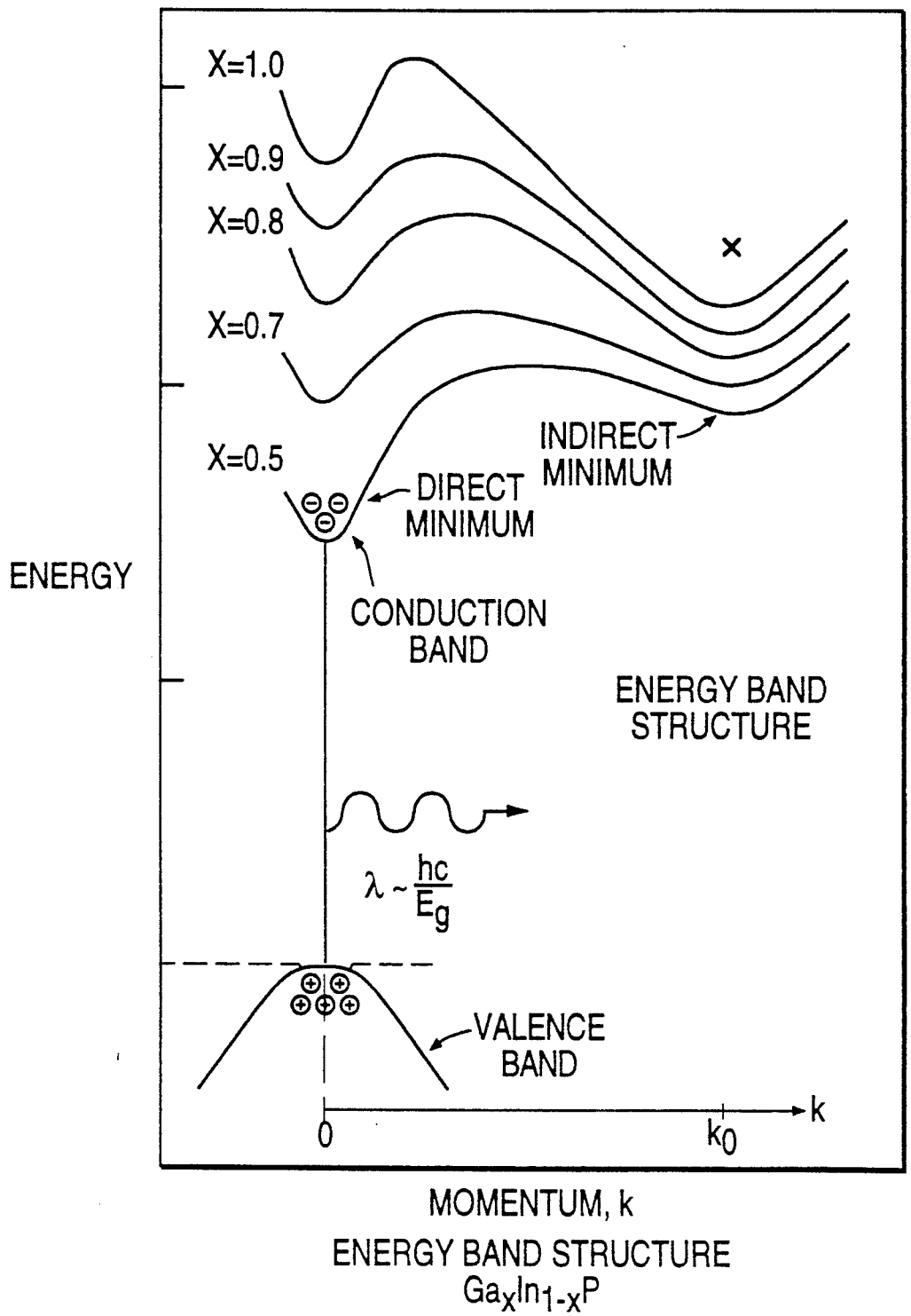
FIG. 13 shows an energy band structure for $Ga_xIn_{1-x}P$, with variations in x.

FIG. 13 shows an energy band structure for $Ga_xIn_{1-x}P$, with variations in x. Specifically, FIG. 13 shows the effect on the energy level caused by changes in the momentum k and variations in the parameter x. As noted there, variations of x will change both the direct minimum and the indirect minimum.

Figure 14A:
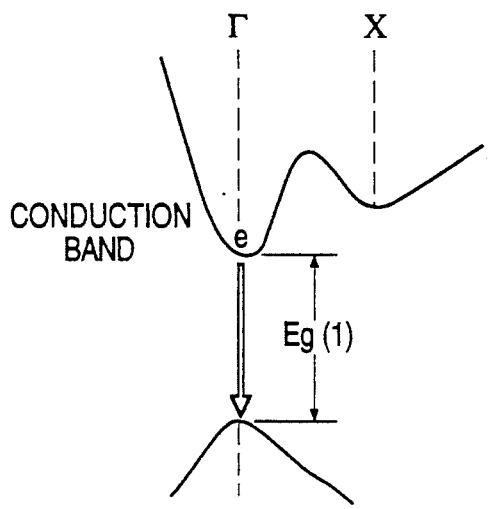
FIGS. 14A–14C are illustrations to show the advantages the present invention with $N_2$ doping in comparison with a device without $N_2$ doping.
Figure 14B:
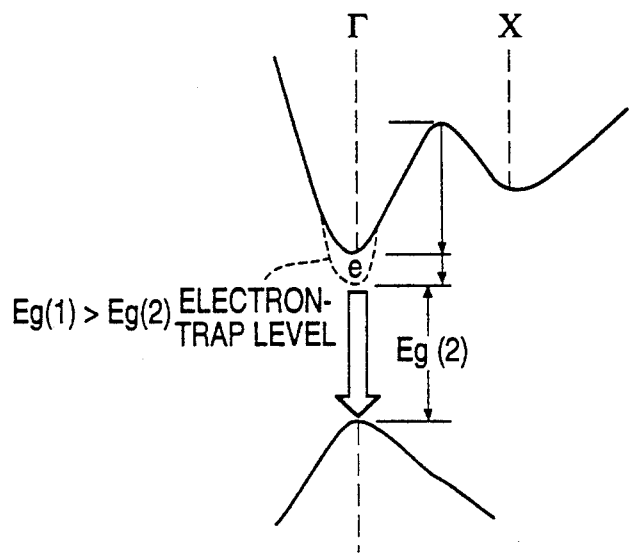
Figure 14C:
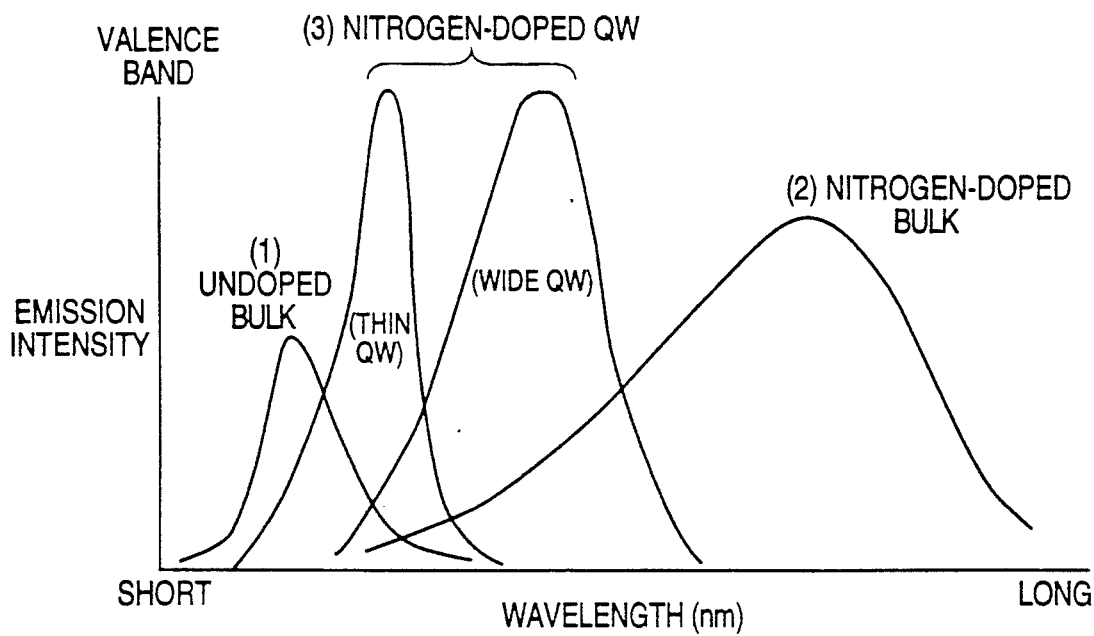

FIGS. 14A, 14B and 14C illustrate the principle of the isoelectronic electron-trap, and the advantages of the present invention in using nitrogen doping, in comparison with not using such doping. Specifically, as can be seen from comparing FIG. 14A with 14B, an isoelectronic electron-trap is formed due to nitrogen doping to form the local energy level near the Γ point of the conduction band structure. This serves to cause an increase in the potential depth to capture electrons. In particular, the nitrogen doping brings about a larger emission intensity of the photoluminescence and electraluminescence, which means an increase in the probability of the direct-transition electron-hole recombination. As can be seen from the fact that Eg(1) of the device without nitrogen doping is greater than Eg(2) of the nitrogen doped device, the present invention uses a reduction in bandgap energy to increase the emission intensity.

In FIG. 14C, the waveform (1) illustrates the emission intensity in the bulk if no nitrogen doping is provided. Although a short wavelength can be obtained, the emission intensity is very low so that practical lasing is not possible. The waveform (2) illustrates the emission intensity in the bulk if nitrogen doping is provided. It can be seen that this is much larger, but also increases the wavelength. Accordingly, the energy level of the quantum wells is designed to be larger than that of the bulk layers, based on the quantum size effect obtained by using quantum wells. This permits thin quantum well and wide quantum well waveforms such as (3) of FIG. 14C, corresponding, respectively, to waveforms that can be obtained using the structures of FIGS. 2 and 4. Thus, both high emission intensity and short wavelength can be obtained to provide practical lasers in accordance with the present invention.

It is to be understood that the above-described arrangements are simply illustrative of the application of the principles of this invention. Numerous other arrangements may be readily devised by those skilled in the art which embody the principles of the invention and fall within its spirit and scope.

What is claimed is

1. A semiconductor laser diode comprising a double heterojunction structure formed on a GaP semiconductor substrate, wherein an optical waveguide layer and an active layer are grown by metal organic chemical vapor deposition (MOCVD) or molecular beam epitaxy (MBE), wherein the optical waveguide layer has a large bandgap energy and is made of $Al_yGa_{1-y}P$ ($0 \leq y \leq 1$), wherein the active layer has a small bandgap energy and is made of $Ga_xIn_{1-x}P$ ($0 < x < 1$) of the direct transition type, wherein at least one of the optical waveguide layer and the active layer is doped with nitrogen as an impurity dopant in addition to a dopant of a conductivity type, and wherein the $Ga_xIn_{1-x}P$ active layer is formed on the semiconductor substrate to a thickness less than a critical thickness for a composition "x" (wherein the critical thickness is a maximum thickness of said active layer, above which dislocations will be formed in said active layer due to compressive strain).

2. A semiconductor laser diode according to claim 1, wherein the active layer is formed with a single or multiple quantum well structure comprising a $Ga_{x1}In_{1-x1}P$ $(0<x_1<1)$ quantum barrier layer and $Ga_{x2}In_{1-x2}P$ $(0<x2<x1<1)$ quantum well layer, at least the quantum well layer is made of a direct-transition-type composition, and at least the quantum barrier layer is doped with nitrogen as an impurity.

3. A semiconductor laser diode according to claim 1 or 2, wherein the composition x1 of the $Ga_{x1}In_{1-x1}P$ quantum barrier layer satisfies $0.65<x_1<1$, the layer thickness $L_B$ satisfies $0.2\ nm<L_B<25\ nm$, the composition x2 of the $Ga_{x2}In_{1-x2}P$ quantum well layer satisfies $0.60<x_2<0.75$, and the layer thickness $L_Z$ satisfies $0.2\ nm<L_Z<15\ nm$.

4. A semiconductor laser diode according to claim 1 or 2, wherein the active layer is formed of a superlattice formed by a plurality of layer sets, wherein each of said layer sets comprises a $Ga_{x1}In_{1-x1}P$ thin barrier layer, which is comprised of one to several atomic layers, and a $Ga_{x2}In_{1-x2}P$ thin well layer, which is comprised of one to several atomic layers.

5. A semiconductor laser diode according to claim 2, wherein the quantum barrier layer is formed of a superlattice formed by a plurality of layer sets, wherein each of said layer sets comprises a $Ga_{x1}In_{1-x1}P$ thin barrier layer, which is comprised of one to several atomic layers, and a $Ga_{x2}In_{1-x2}P$ thin well layer, which is comprised of one to several atomic layers.

6. A semiconductor laser diode according to claim 1 or 2, wherein at least one of the optical waveguide layer and the active layer is doped with nitrogen by using $NH_3$ or dimethylhydrazene or plasma $N_2$ radical as a source material and its concentration ranges from $1 \times 10^{17}$ to $1 \times 10^{20}\ cm^{-3}$.

7. A semiconductor laser diode according to claim 1 or 2, wherein the optical waveguide layer includes regions of high nitrogen concentration extending 0.1 to 0.2 μm from both ends of the active layer, and the nitrogen concentration ranges from $5 \times 10^{18}$ to $1 \times 10^{20\ cm-3}$.

8. A semiconductor laser diode according to claim 1 or 2, wherein a GRIN (Graded Index) layer made by gradually changing the composition A1 of the quantum barrier layer from 0 to $Y_1$ or a step layer whose thickness is increased like a staircase is formed as a separate confinement heterostructure.

9. A semiconductor laser diode according to claim 1 or 2, wherein the semiconductor substrate has a surface tilted in the direction of $[110][\bar{1}\bar{1}0]$ from the surface (001) or tilted at an angle of 0 to 54.7° in the direction of $[110][\bar{1}\bar{1}0]$ from the surface.

10. A semiconductor laser diode comprising a double heterojunction structure formed on a GaP semiconductor substrate, including an $Al_yGa_{1-y}P$ $(0 \leq y \leq 1)$ optical waveguide layer having a predetermined large bandgap energy, and a compressively strained $Ga_xIn_{1-x}P$ $(0<x<1)$ active layer with a predetermined small bandgap energy of the direct transition type, wherein at least one of the optical waveguide layer and the active layer is doped with nitrogen as an impurity dopant in addition to a dopant of a conductivity type, and wherein the compressively strained $Ga_xIn_{1-x}P$ active layer is formed on the semiconductor substrate to a thickness less than a critical thickness for a composition "x" (wherein the critical thickness is a maximum thickness of said active layer, above which dislocations will be formed in said active layer due to compressive strain).

11. A semiconductor laser diode according to claim 10, wherein said optical waveguide layer and said active layer are grown by a metal-organic chemical vapor deposition (MOCVD).

12. A semiconductor laser diode according to claim 10, wherein said optical waveguide layer and said active layer are grown by molecular beam epitaxy (MBE).

13. A semiconductor laser diode comprising a double heterojunction structure formed on a GaP semiconductor substrate, including an $Al_yGa_{1-y}P$ $(0<y<1)$ optical waveguide layer having a predetermined large bandgap energy, and a compressively strained $Ga_xIn_{1-x}P$ $(0<x<1)$ active layer with a small forbidden band width of the direct transition type, wherein the compressively strained $Ga_xIn_{1-x}P$ active layer is formed on the semiconductor substrate to a thickness less than a critical thickness for a composition "x" (wherein the critical thickness is a maximum thickness of said active layer, above which dislocations will be formed in said active layer due to compressive strain).

14. A semiconductor laser diode according to claim 13, wherein said optical waveguide layer and said active layer are grown by a metal-organic chemical vapor deposition (MOCVD).

15. A semiconductor laser diode according to claim 13, wherein said optical waveguide layer and said active layer are grown by molecular beam epitaxy (MBE).

* * * * *